United States Patent
Nguyen et al.

(10) Patent No.: US 6,207,544 B1
(45) Date of Patent: Mar. 27, 2001

(54) METHOD OF FABRICATING ULTRA THIN NITRIDE SPACERS AND DEVICE INCORPORATING SAME

(75) Inventors: Thien T. Nguyen, Austin; Mark I. Gardner, Cedar Creek, both of TX (US); Charles E. May, Gresham, OR (US)

(73) Assignee: Advanced Micro Devices, Inc., Austin, TX (US)

( * ) Notice: Subject to any disclaimer, the term of this patent is extended or adjusted under 35 U.S.C. 154(b) by 0 days.

(21) Appl. No.: 09/207,808

(22) Filed: Dec. 9, 1998

(51) Int. Cl.[7] .................................................. H01L 21/3065
(52) U.S. Cl. ............................ 438/595; 438/696; 438/724
(58) Field of Search .................................. 438/696, 724, 438/595, 303, 230, FOR 188, FOR 199, FOR 401, FOR 388

(56) References Cited

U.S. PATENT DOCUMENTS

| 5,246,529 | * | 9/1993 | Fukusawa et al. . |
| 5,695,602 | * | 12/1997 | Takeshiro . |
| 5,739,573 | * | 4/1998 | Kawaguchi . |
| 5,989,979 | * | 11/1999 | Liu et al. . |
| 6,010,927 | * | 1/2000 | Jones, Jr. et al. . |
| 6,046,471 | * | 4/2000 | Gardner et al. . |
| 6,090,691 | * | 7/2000 | Ang et al. . |

* cited by examiner

Primary Examiner—George Fourson
(74) Attorney, Agent, or Firm—Williams, Morgan & Amerson, P.C.

(57) ABSTRACT

The present invention is directed to a method of fabricating very thin silicon nitride spacers on a transistor, and to a device comprising such spacers. In one illustrative embodiment, the method comprises forming a gate dielectric above a surface of a semiconducting substrate, forming a gate conductor above the gate dielectric, and forming a layer of silicon nitride above the substrate. The method further comprises performing at least one anisotropic etching process on the layer of silicon nitride using an etching recipe comprised of helium (He), sulfur hexafluoride ($SF_6$) and hydrogen bromide (HBr). The transistor of the present invention is comprised of a gate dielectric positioned above the surface of a semiconducting substrate and a gate conductor positioned above the gate dielectric. The transistor further comprises a plurality of source/drain regions formed in the substrate adjacent the gate dielectric and a plurality of sidewall spacers comprised of silicon nitride, each of the sidewall spacers having a thickness that ranges from approximately 200–350 Å.

35 Claims, 2 Drawing Sheets

METHOD OF FABRICATING ULTRA THIN NITRIDE SPACERS AND DEVICE INCORPORATING SAME

BACKGROUND OF THE INVENTION

1. Field of the Invention

The present invention is generally directed to the field of semiconductor processing, and, more particularly, to the formation of ultra thin sidewall spacers adjacent the gate dielectric and gate conductor of a transistor.

2. Description of the Related Art

As shown in FIG. 1, a typical field effect transistor 10 is comprised of a gate dielectric 12 positioned above a surface 11 of a semiconducting substrate 13, a gate conductor 14 positioned above the gate dielectric 12, and a plurality of sidewall spacers 20 formed adjacent the gate dielectric 12 and gate conductor 14. The sidewall spacers 20 may be comprised of a variety of materials, such as, for example, silicon dioxide. Additionally, a typical transistor 10 is also comprised of a plurality of source/drain regions 16 formed in the substrate 13. Each of the source/drain regions 16 may also have extensions 18 which have a width corresponding to the dimension "X" shown in FIG. 1.

The transistor 10 depicted in FIG. 1 may be formed by a variety of known techniques. For example, the gate dielectric 12 and gate conductor 14 may be constructed by forming a plurality of process layers above the surface 11 of the substrate 13 and, thereafter, patterning those process layers using traditional photolithography and etching processes to define the gate dielectric 12 and the gate conductor 14. Thereafter, the device may be subjected to an initial ion implantation process at a relatively light concentration of dopant atoms. This initial doping process results in dopant atoms penetrating the surface 11 of the substrate 13 to a depth defined by the dashed line 19, as shown in FIG. 1. As those skilled in the art will recognize, the region formed during the initial doping process is self-aligned to the gate dielectric 12. Next, a plurality of sidewall spacers 20 are formed adjacent the gate dielectric 12 and gate conductor 14 using a variety of known techniques. For example, a layer of the appropriate material, e.g., silicon dioxide, silicon nitride, etc., may be deposited above the gate conductor 14 and the surface 11 of the substrate 13 and, thereafter, subjected to one or more anisotropic etching processes. If desired, an initial layer of silicon dioxide (not shown) may be formed above the surface 11 of the substrate 13 prior to the formation of the layer of silicon nitride. After the sidewall spacers 20 are formed, the device is then subjected to a second ion implantation process at a heavier dopant concentration to result in the final formation of the source/drain regions 16. Note that during the second doping process, the sidewall spacers 20 act as a mask to prevent the heavier dopant concentration from being implanted into the substrate 13 under the sidewall spacers 20, leaving the source/drain regions 18 generally below the sidewall spacers 20.

Those skilled in the art will recognize that the source/drain regions 16 depicted in FIG. 1 have a traditional lightly doped drain structure ("LDD") commonly encountered in modern semiconductor devices. Such LDD structures are useful for various reasons, including, but not limited to, reducing hot carrier effects in field effect transistors. The width "X" of the extension 18 of the source/drain region 16 is determined by the width of the sidewall spacer 20, as measured at the surface 11 of the substrate 13. Traditionally, sidewall spacers 20 are formed having a thickness that ranges from approximately 700–1100 Å. It has been observed that, all other things being equal, transistor performance, e.g., operating speed, may be increased if the width "X" of the extension 18 of the source/drain region 16 is decreased such that it has a width as small as approximately 200 Å. Of course, the performance of such transistors is a very complex activity that is governed by a variety of factors. Because the thickness of the sidewall spacers 20 approximately determines the width "X" of the extensions 18 of the source/drain regions 16, it is desirable to have a process for forming such spacers 20 that is controllable and allows formation of very thin sidewall spacers 20.

Transistors may also be subjected to a salicidation process to, among other things, decrease the resistance of the polysilicon gate conductor 14 and the source/drain regions 16. During this salicidation process, there is a potential for bridging across the sidewall spacers 20, i.e., a conductive metal silicide, e.g., titanium silicide ($TiS_2$), may be formed across the sidewall spacers 20. This bridging can, in effect, act as a short circuit between the gate conductor 14 and the source/drain regions 16. Thus, it is desirable that sidewall spacers 20 be comprised of a material and have a profile, i.e., straighter, more vertical sidewalls, that helps to reduce or prevent this undesirable bridging by, among other things, making it easier to remove the salicide metal formed on the sidewall spacers 20. However, using existing methods and etching recipes, sidewall spacers 20 comprised of silicon nitride tend to have a more bulging, rounded profile similar to the sidewall spacers 20 depicted in FIG. 1. What is desired is a method for making very thin sidewall spacers comprised of silicon nitride that have straighter sidewalls than those currently available using existing technology.

The present invention is directed to a method and apparatus that minimizes or reduces some or all of the aforementioned problems and a method of making same.

SUMMARY OF THE INVENTION

The present invention is directed to a method of fabricating very thin silicon nitride spacers on a transistor, and to a device comprising such spacers. In one illustrative embodiment, the method comprises forming a gate dielectric above a surface of a semiconducting substrate, forming a gate conductor above the gate dielectric, and forming a layer of silicon nitride above the substrate. The method further comprises performing at least one anisotropic etching process on the layer of silicon nitride using an etching recipe comprised of helium (He), sulfur hexafluoride ($SF_6$) and hydrogen bromide (HBr). In one illustrative embodiment of the present invention, the etching recipe is comprised of approximately 200–300 cubic centimeters of helium, approximately 50–85 cubic centimeters of sulfur hexafluoride, and approximately 10–30 cubic centimeters of hydrogen bromide. In yet another illustrative embodiment of the present invention, a second anisotropic etching process may be performed using an etching recipe comprised of helium (He), Freon-14 ($CF_4$), and Freon-23 ($CHF_3$).

The transistor of the present invention is comprised of a gate dielectric positioned above the surface of a semiconducting substrate and a gate conductor positioned above the gate dielectric. The transistor further comprises a plurality of source/drain regions formed in the substrate adjacent the gate dielectric and a plurality of sidewall spacers comprised of silicon nitride, each of the sidewall spacers having a thickness that ranges from approximately 200–350 Å.

BRIEF DESCRIPTION OF THE DRAWINGS

The invention may be understood by reference to the following description taken in conjunction with the accom

Figure 1:
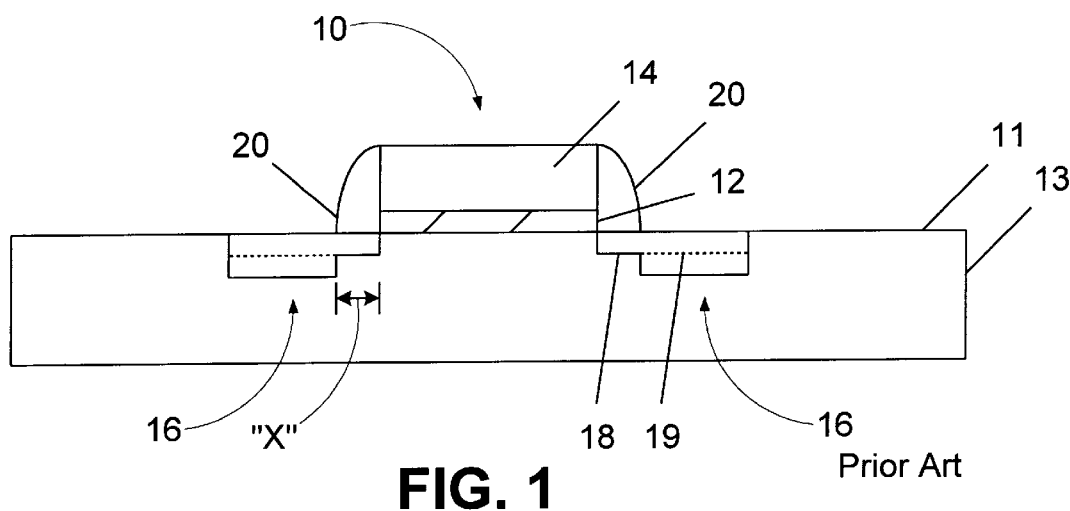
- FIG. 1 is a cross-sectional view of an illustrative transistor made in accordance with the prior art techniques.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF THE INVENTION

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present invention will now be described with reference to FIGS. 2–3. Although the various regions and structures of a semiconductor device are depicted in the drawings as having very precise and sharp configurations and profiles, those skilled in the art recognize that, in reality, these regions and structures are not as precise as indicated in the drawings. Additionally, the relative sizes of the various features depicted in the drawings may be exaggerated or reduced as compared to the size of those feature sizes on fabricated devices. Nevertheless, the attached drawings are included to describe and explain illustrative examples of the present invention.

In general, the present invention is directed to a method of fabricating very thin sidewall spacers comprised of silicon nitride, and a transistor incorporating such sidewall spacers. As will be readily apparent to those skilled in the art upon a complete reading of the present application, the present invention is applicable to a variety of technologies, e.g., NMOS, PMOS, CMOS, etc., and is readily applicable to a variety of devices, including, but not limited to, logic devices, memory devices, etc.

Figure 2:
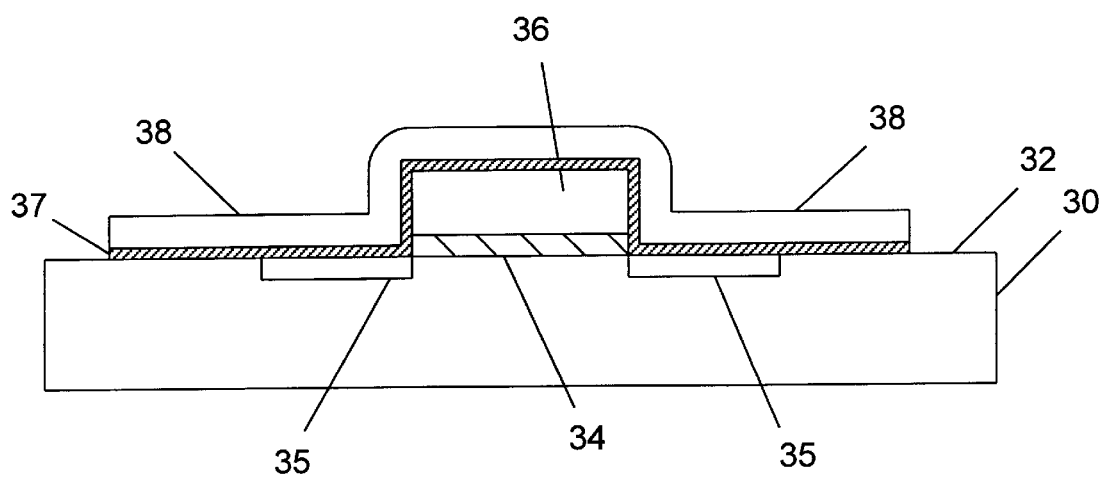
FIG. 2 is a cross-sectional view of a partially formed semiconductor device having a gate dielectric and a gate conductor formed above a semiconducting substrate, and a conformal process layer formed thereabove.

As shown in FIG. 2, a gate dielectric 34 and a gate conductor 36 are formed above a surface 32 of a semiconducting substrate 30. In one illustrative embodiment, the semiconducting substrate 30 is comprised of silicon. In general, the gate dielectric 34 and gate conductor 36 may be created by forming a plurality of process layers comprised of the appropriate material above the surface 32 of the substrate 30 and, thereafter, patterning the process layers using known photolithography and etching techniques to define the gate dielectric 34 and gate conductor 36. The gate dielectric 34 and the gate conductor 36 may be made from a variety of materials. For example, the gate dielectric 34 may be comprised of silicon dioxide, and the gate conductor 36 may be comprised of polysilicon. The process layers that will be patterned to define the gate dielectric 34 and the gate conductor 36 may be formed using a variety of known techniques, e.g., chemical vapor deposition (CVD), low pressure chemical vapor deposition (LPCVD), thermal growing, etc. A variety of other known techniques may be used to form the gate dielectric 34 and gate conductor 36, and the particular techniques disclosed herein for the formation of these components should not be considered a limitation of the present invention.

After the gate dielectric 34 and gate conductor 36 are formed, the device is subjected to an initial ion implantation process involving a relatively light concentration of dopant atoms. This process results in the formation of the doped regions 35 in the substrate 30. Note that the doped regions 35 are self-aligned to the gate dielectric 34 of the device. Of course, the appropriate dopant atoms will vary depending upon the technology involved, e.g., arsenic for NMOS, boron for PMOS, etc.

Either before or after the initial ion implantation process, a process layer 37 may be formed above the surface 32 and above the gate conductor 36 as shown in FIG. 2. The process layer 37 may be comprised of a variety of materials, such as, for example, silicon dioxide, and may have a thickness ranging from approximately 100–300 Å. The process layer 37 may be formed by a variety of techniques, such as, for example, CVD, PECVD, plasma deposition, thermal growing, etc. In one illustrative embodiment, the process layer 37 is comprised of a deposited layer of silicon dioxide having a thickness of approximately 100 Å. As will be apparent to those skilled in the art upon a complete reading of the present application, the process layer 37 provides some degree of protection to the surface 32 of the substrate 30 during an etching process (described more fully below) used to form sidewall spacers comprised of silicon nitride.

Next, in the case where a process layer 37 is used, a process layer 38 comprised of silicon nitride is formed above the process layer 37. Alternatively, if the process layer 37 is not used, the process layer 38 would be formed above the surface 32 of the substrate 30 and above the gate conductor 36. The process layer 38 may be formed by a variety of techniques for forming such layers, including, but not limited to, plasma enhanced chemical vapor deposition (PECVD) or low pressure chemical vapor deposition (LPCVD). Additionally, the thickness of the process layer 38 may be varied as a matter of design choice. For example, the process layer 38 may be formed to have a thickness ranging from approximately 300–1000 Å. In one illustrative embodiment, the process layer 38 is formed by a PECVD process and has a thickness ranging from approximately 300–500 Å. Note that the processes described herein for forming sidewall spacers comprised of silicon nitride may be used on layers of silicon nitride formed by either a PECVD process or an LPCVD process.

Figure 3:
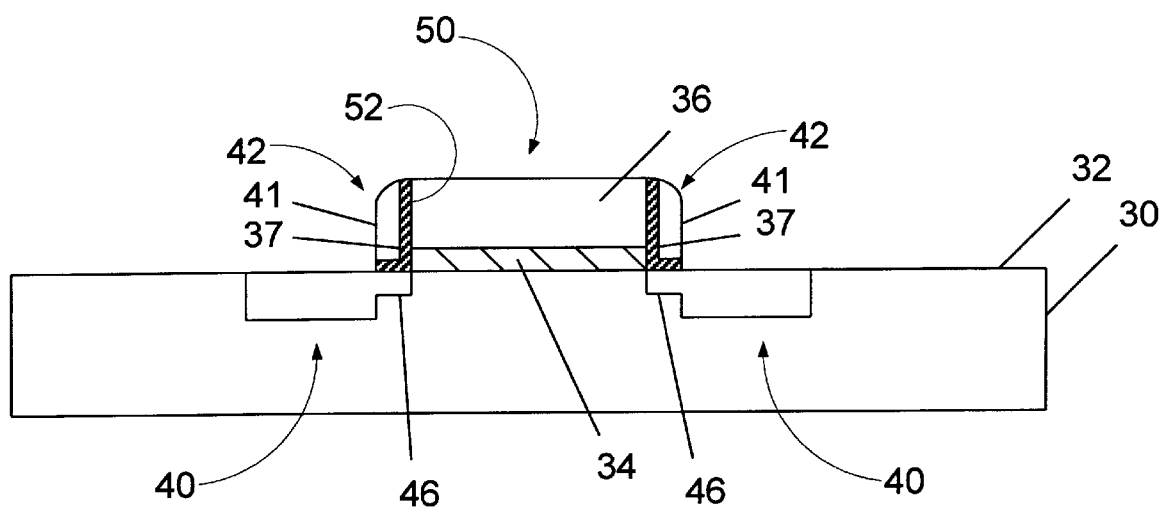
FIG. 3 is a cross-sectional view of an illustrative semiconductor device having silicon nitride spacers formed in accordance with the present invention.

Next, using the inventive method disclosed herein, at least one anisotropic etching process is performed on the process layer 38 to result in the sidewall spacers 42 depicted in FIG. 3. Using the inventive methods disclosed herein, the sidewall spacers 42 comprised of silicon nitride may have a thickness ranging from approximately 200–350 Å as measured at the point where the sidewall spacers 42 intersect the process layer 37, or the surface 32 of the substrate 30. This is in contrast to sidewall spacers formed using known process technologies that have a thickness ranging from approximately 700–1100 Å. Additionally, the sidewall spacers 42 formed in accordance with the methods disclosed herein have a more desirable profile than sidewall spacers formed with known etching processes. That is, as shown in FIG. 3, sides 41 of the sidewall spacers 42 formed in accordance with the present invention are straighter and more vertical than the sides of silicon nitride sidewall spacers formed using known etching recipes.

One illustrative embodiment of the present invention involves the use of one or more anisotropic etching processes to form the very thin silicon nitride sidewall spacers 42. The etching processes may be a plasma etching process, a reactive ion etching process, or a magnetically enhanced reactive ion etching process. If a multiple step etching process is used, the multiple processes may be performed in situ, i.e., without removing the wafer from the processing chamber. Additionally, a variety of different types of etching equipment may be used to practice the present invention. In one illustrative example, the etching processes may be performed in a LAM Rainbow parallel plate high frequency (13.56 MHz) diode type etcher manufactured by LAM Research Corporation. Of course, other etching equipment may be used. However, use of other equipment may require some changes to the precise process parameters described herein.

In one embodiment, an anisotropic plasma etching process using an etching recipe comprised of helium (He), sulfur hexafluoride ($SF_6$) and hydrogen bromide (HBr) is used to form the sidewall spacers 42. Of course, additional gases, in either trace or substantive quantities, may also be used during the etching process. This etching process may be performed at a pressure ranging from approximately 200–300 milliTorr (mT) and an energy level ranging from approximately 250–350 Watts. Additionally, the top and bottom plates of the illustrative parallel plate etcher may be spaced apart by a distance that ranges from approximately 0.7–1.1 centimeters.

The quantity of the helium (He), sulfur hexafluoride ($SF_6$) and hydrogen bromide (HBr) used in the etching process may be varied as a matter of design choice or depending upon the particular application and/or equipment used in the etching process. In one illustrative embodiment, approximately 200–300 cubic centimeters (cc) of helium, approximately 55–85 cc of sulfur hexafluoride, and approximately 10–30 cc of hydrogen bromide may be used during this etching process. Another illustrative embodiment of the present invention involves the use of approximately 225–275 cc of helium, 65–75 cc of sulfur hexafluoride, and 17–23 cc of hydrogen bromide during the initial etching process. In another embodiment of the present invention, this etching process is performed at a pressure of approximately 250 mT, an energy level of approximately 300 Watts, with the plates of the etching equipment being spaced apart approximately 0–9 cm, and approximately 250 cc of helium, 70 cc of sulfur hexafluoride, and 20 cc of hydrogen bromide. Using this embodiment, the silicon nitride may be removed at a rate of approximately 3400 Å per minute and the etching process has a selectivity ratio, with respect to silicon dioxide, of approximately 2:1. This selectivity ratio is beneficial in situations where the process layer 37, e.g., approximately 100–200 Å of silicon dioxide, is formed above the surface 32 of the substrate 30 prior to the formation of the process layer 38 comprised of silicon nitride. The selectivity ratio allows, in effect, a margin or error for stopping the etching process used to remove portions of the process layer 38 prior to etching into the silicon substrate 30.

Additionally, the process described above provides better control during the formation of the sidewall spacers 42 comprised of silicon nitride. For example, using the process described above, less than 6% of the nitride film removed will fall outside of three standard deviations of the desired thickness. This etching process may be used to provide rapid removal of the bulk, i.e., 95–99%, of the silicon nitride. For example, assuming the process layer 38 is approximately 900 Å thick, then the etching process would be performed for approximately 15 seconds. Endpoint detection of the etching process is accomplished using traditional optical spectrometers, and is determined by observation of silicon nitride signature at a wavelength of 405 nanometers.

The use of the helium in the initial etching process assists in achieving two objectives. First, the helium acts to provide a more uniform plasma field, thereby assisting in achieving more uniform etching results. Second, the helium makes endpoint detection easier, i.e., depending upon the quantity of helium used, it makes the peak seen in the spectrometer more pronounced, and thus easier to recognize as the process endpoint. In this regard, generally the greater the quantity of helium, the easier it is to recognize the point at which the silicon nitride has been removed. For example, the use of approximately 50 cc of helium will still provide assistance in recognizing endpoint detection. However, using approximately 250 cc of helium, will, in addition to other things, make endpoint detection easier.

If desired, a second etching process may be used to provide fine control. In general, this second etching process is also an anisotropic etching process performed at a pressure ranging from approximately 350–400 mT, at an energy level ranging from approximately 350–400 Watts, and with the plates of the illustrative etching equipment spaced apart a distance of approximately 1.0–1.5 cm from the electrode. In one illustrative embodiment of this second process, approximately 200–300 cc of helium (He), 5–15 cc of Freon-14 ($CF_4$), and 20–30 cc of Freon-23 ($CHF_3$) are used. Another illustrative embodiment of the second process involves the use of approximately 225–275 cc of helium, 7–12 cc of Freon-14, and 22–28 cc of Freon-23. In another embodiment of the present invention, the second etching process is performed at a pressure of approximately 400 mT, an energy level of approximately 400 Watts, with the plates of the illustrative etching equipment spaced apart by a distance of approximately 1.2 cm, and with approximately 250 cc of helium, approximately 10 cc of Freon-14, and approximately 25 cc of Freon-23. Using this embodiment, the silicon nitride may be removed at a rate of approximately 500 Å per minute and the etching process has a selectivity ratio of approximately 2:1 (silicon nitride with respect to silicon dioxide) and approximately 10:1 (silicon dioxide with respect to silicon). During the second etch process, the Freon-14 to Freon-23 ratio varies between approximately 0.3–0.5, and preferably is approximately 0.4. This ratio provides good etch selectivity for silicon nitride over silicon dioxide.

As will be recognized by those skilled in the art upon a complete reading of the present application, a very thin nitride spacer can be formed in accordance with the present invention by using only one of the aforementioned steps, i.e., it is not necessary to use two separate etching steps. That is, the sidewall spacers 42 of the present invention may be formed using only the initial etching process described above.

After the sidewall spacers 42 comprised of silicon nitride have been formed in accordance with the present invention, the device is subjected to a second ion implantation process at a higher concentration of dopant atoms to complete the formation of the source/drain regions 40 depicted in FIG. 3.

As shown in FIG. 3, the present invention is also directed to a transistor 50 comprised of a gate dielectric 34, a gate conductor 36, a plurality of sidewall spacers 42, and a plurality of source/drain regions 40. The sidewall spacers 42 are comprised of silicon nitride. The sidewall spacers 42 have a thickness, as measured at the surface 32 of the substrate 30, that ranges from approximately 200–350 Å. The process layer 37, if used, would also be included in this 200–350 Å thickness range. Additionally, the sides 41 of the sidewall spacers 42 are substantially vertical (with respect to the surface 32 of the substrate 30) and extend substantially along the entire combined height of the gate dielectric 34 and the gate conductor 36. The transistor 50 with the improved silicon nitride sidewall spacers 42 provides a transistor with increased performance, e.g., operating speed, as compared to prior art transistors, and provides sidewall spacers 42 that may be of assistance in reducing bridging problems.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method of forming silicon nitride sidewall spacers on a transistor, comprising:
    forming a gate dielectric above a surface of a semiconducting substrate;
    forming a gate conductor above said gate dielectric;
    forming a layer of silicon nitride above said substrate; and
    performing at least one anisotropic etching process on said layer of silicon nitride using a recipe comprised of helium (He), sulfur hexafluoride ($SF_6$), and hydrogen bromide (HBr).

2. The method of claim 1, wherein said step of performing at least one anisotropic etching process on said layer of silicon nitride using a recipe comprised of helium (He), sulfur hexafluoride ($SF_6$), and hydrogen bromide (HBr) comprises performing at least one anisotropic etching process on said layer of silicon nitride using a recipe comprised of approximately 200–300 cubic centimeters of helium (He), approximately 50–85 cubic centimeters of sulfur hexafluoride ($SF_6$), and approximately 10–30 cubic centimeters of hydrogen bromide (HBr).

3. The method of claim 1, wherein said step of performing at least one anisotropic etching process on said layer of silicon nitride using a recipe comprised of helium (He), sulfur hexafluoride ($SF_6$), and hydrogen bromide (HBr) comprises performing at least one anisotropic etching process on said layer of silicon nitride using a recipe comprised of approximately 225–275 cubic centimeters of helium (He), approximately 65–75 cubic centimeters of sulfur hexafluoride ($SF_6$), and approximately 15–25 cubic centimeters of hydrogen bromide (HBr).

4. The method of claim 1, wherein said step of performing at least one anisotropic etching process on said layer of silicon nitride using a recipe comprised of helium (He), sulfur hexafluoride ($SF_6$), and hydrogen bromide (HBr) comprises performing at least one anisotropic etching process on said layer of silicon nitride using a recipe comprised of approximately 250 cubic centimeters of helium (He), approximately 75 cubic centimeters of sulfur hexafluoride ($SF_6$), and approximately 20 cubic centimeters of hydrogen bromide (HBr).

5. The method of claim 1, wherein said anisotropic etching process is performed at a pressure ranging from approximately 200–300 milliTorr and at an energy level of approximately 250–350 watts.

6. The method of claim 1, wherein said anisotropic etching process is performed at a pressure of approximately 250 milliTorr and at an energy level of approximately 300 watts.

7. The method of claim 1, wherein said step of forming a layer of silicon nitride above said substrate comprises forming a layer of silicon nitride above said substrate by a plasma enhanced chemical vapor deposition process or by a low pressure chemical vapor deposition process.

8. The method of claim 1, further comprising forming a layer of silicon dioxide above said surface of said substrate prior to said step of forming said layer of silicon nitride.

9. The method of claim 1, wherein said anisotropic etching process is a plasma etching process, a reactive ion etching process, or a magnetically enhanced reactive ion etching process.

10. The method of claim 1, wherein said step of performing at least one anisotropic etching process on said layer of silicon nitride using a recipe comprised of helium (He), sulfur hexafluoride ($SF_6$), and hydrogen bromide (HBr) comprises performing at least one anisotropic etching process on said layer of silicon nitride using a recipe comprised of helium (He), sulfur hexafluoride ($SF_6$), and hydrogen bromide (HBr) to define a plurality of sidewall spaces adjacent at least said gate dielectric, each of said sidewall spacers having a thickness that ranges from approximately 200–350 Å.

11. The method of claim 1, further comprising performing at least one additional anisotropic etching process using an etching recipe comprised of helium (He), Freon-14 ($CF_4$) and Freon-23 ($CHF_3$).

12. The method of claim 1, further comprising performing at least one additional anisotropic etching process using an etching recipe comprised of approximately 200–300 cubic centimeters of helium (He), approximately 7–13 cubic centimeters of Freon-14 ($CF_4$) and approximately 20–30 cubic centimeters of Freon-23 ($CHF_3$).

13. The method of claim 1, further comprising performing at least one additional anisotropic etching process using an etching recipe comprised of approximately 250 cubic centimeters of helium (He), approximately 10 cubic centimeters of Freon-14 ($CF_4$) and approximately 25 cubic centimeters of Freon-23 ($CHF_3$).

14. The method of claim 11, wherein said additional anisotropic etching process is performed at a pressure ranging from approximately 300–500 milliTorr and at an energy level ranging from approximately 300–500 watts.

15. A method of forming silicon nitride sidewall spacers on a transistor, comprising:
    forming a gate dielectric above a surface of a semiconducting substrate;
    forming a gate conductor above said gate dielectric;
    forming a layer of silicon nitride above said substrate; and
    forming said spacers by performing at least one anisotropic etching process on said layer of silicon nitride using a recipe comprised of approximately 200–300 cubic centimeters of helium (He), approximately 50–85 cubic centimeters of sulfur hexafluoride ($SF_6$), and approximately 10–30 cubic centimeters of hydrogen bromide (HBr).

16. The method of claim 15, wherein said step of performing at least one anisotropic etching process on said layer of silicon nitride comprises performing at least one anisotropic etching process on said layer of silicon nitride using a recipe comprised of approximately 225–275 cubic centimeters of helium (He), approximately 65–75 cubic centimeters of sulfur hexafluoride ($SF_6$), and approximately 15–25 cubic centimeters of hydrogen bromide (HBr).

17. The method of claim 15, wherein said step of performing at least one anisotropic etching process on said layer of silicon nitride comprises performing at least one anisotropic etching process on said layer of silicon nitride using a recipe comprised of approximately 250 cubic centimeters of helium (He), approximately 75 cubic centimeters of sulfur hexafluoride ($SF_6$), and approximately 20 cubic centimeters of hydrogen bromide (HBr).

18. The method of claim 15, wherein said anisotropic etching process is performed at a pressure ranging from approximately 300–500 milliTorr and at an energy level of approximately 300–500 watts.

19. The method of claim 15, wherein said anisotropic etching process is performed at a pressure of approximately 400 milliTorr and at an energy level of approximately 400 watts.

20. The method of claim 15, wherein said step of forming a layer of silicon nitride above said substrate comprises forming a layer of silicon nitride above said substrate by a plasma enhanced chemical vapor deposition process or by a low pressure chemical vapor deposition process.

21. The method of claim 15, further comprising forming a layer of silicon dioxide above said surface of said substrate prior to said step of forming said layer of silicon nitride.

22. The method of claim 15, wherein said anisotropic etching process is a plasma etching process, a reactive ion etching process, or a magnetically enhanced reactive ion etching process.

23. The method of claim 15, wherein said step of performing at least one anisotropic etching process on said layer of silicon nitride comprises performing at least one anisotropic etching process on said layer of silicon nitride using a recipe comprised of approximately 200–300 cubic centimeters of helium (He), approximately 50–85 cubic centimeters of sulfur hexafluoride ($SF_6$), and approximately 10–30 cubic centimeters of hydrogen bromide (HBr) to define a plurality of sidewall spacers adjacent said gate conductor, each of said sidewall spacers having a thickness that ranges from approximately 200–350 Å.

24. The method of claim 15, wherein said step of forming said spacers further comprises performing at least one additional anisotropic etching process using an etching recipe comprised of helium (He), Freon-14 ($CF_4$) and Freon-23 ($CHF_3$).

25. The method of claim 15, wherein said step of forming said spacers further comprises performing at least one additional anisotropic etching process using an etching recipe comprised of approximately 200–300 cubic centimeters of helium (He), approximately 7–13 cubic centimeters of Freon-14 ($CF_4$) and approximately 20–30 cubic centimeters of Freon-23 ($CHF_3$).

26. The method of claim 15, wherein said step of forming said spacers further comprises performing at least one additional anisotropic etching process using an etching recipe comprised of approximately 250 cubic centimeters of helium (He), approximately 10 cubic centimeters of Freon-14 ($CF_4$) and approximately 25 cubic centimeters of Freon-23 ($CHF_3$).

27. The method of claim 24, wherein said additional anisotropic etching process is performed at a pressure ranging from approximately 300–500 milliTorr and at an energy level ranging from approximately 300–500 watts.

28. A method of forming silicon nitride sidewall spacers on a transistor, comprising:
    forming a gate dielectric above a surface of a semiconducting substrate;
    forming a gate conductor above said gate dielectric;
    forming a layer of silicon nitride above said substrate; and
    forming said spacers by:
        performing at least one anisotropic etching process on said layer of silicon nitride using a recipe comprised of helium (He), sulfur hexafluoride ($SF_6$), and hydrogen bromide (HBr); and
        performing at least one additional anisotropic etching process using an etching recipe comprised of helium (He), Freon-14 ($CF_4$) and Freon-23 ($CHF_3$).

29. The method of claim 28, wherein said step of performing at least one anisotropic etching process on said layer of silicon nitride using a recipe comprised of helium (He), sulfur hexafluoride ($SF_6$), and hydrogen bromide (HBr) comprises performing at least one anisotropic etching process on said layer of silicon nitride using a recipe comprised of approximately 200–300 cubic centimeters of helium (He), approximately 50–85 cubic centimeters of sulfur hexafluoride ($SF_6$), and approximately 10–30 cubic centimeters of hydrogen bromide (HBr).

30. The method of claim 28, wherein said step of performing at least one anisotropic etching process on said layer of silicon nitride using a recipe comprised of helium (He), sulfur hexafluoride ($SF_6$), and hydrogen bromide (HBr) comprises performing at least one anisotropic etching process on said layer of silicon nitride using a recipe comprised of approximately 225–275 cubic centimeters of helium (He), approximately 65–75 cubic centimeters of sulfur hexafluoride ($SF_6$), and approximately 15–25 cubic centimeters of hydrogen bromide (HBr).

31. The method of claim 28, wherein said step of performing at least one anisotropic etching process on said layer of silicon nitride using a recipe comprised of helium (He), sulfur hexafluoride ($SF_6$), and hydrogen bromide (HBr) comprises performing at least one anisotropic etching process on said layer of silicon nitride using a recipe comprised of approximately 250 cubic centimeters of helium (He), approximately 75 cubic centimeters of sulfur hexafluoride ($SF_6$), and approximately 20 cubic centimeters of hydrogen bromide (HBr).

32. The method of claim 28, wherein said step of performing at least one additional anisotropic etching process further comprises performing at least one additional anisotropic etching process using an etching recipe comprised of approximately 200–300 cubic centimeters of helium (He), approximately 7–13 cubic centimeters of Freon-14 ($CF_4$) and approximately 20–30 cubic centimeters of Freon-23 ($CHF_3$).

33. The method of claim 28, wherein said step of performing at least one additional anisotropic etching process further comprises performing at least one additional anisotropic etching process using an etching recipe comprised of approximately 250 cubic centimeters of helium (He), approximately 10 cubic centimeters of Freon-14 ($CF_4$) and approximately 25 cubic centimeters of Freon-23 ($CHF_3$).

34. The method of claim 28, wherein said at least one additional anisotropic etching process is performed at a pressure of approximately 250 milliTorr and at an energy level of approximately 300 watts.

35. The method of claim 28, wherein said at least one additional anisotropic etching process is performed at a pressure ranging from approximately 300–500 milliTorr and at an energy level ranging from approximately 300–500 watts.

* * * * *